(12) United States Patent
Miyoshi

(10) Patent No.: US 8,126,532 B2
(45) Date of Patent: Feb. 28, 2012

(54) MRI APPARATUS

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 674 days.

(21) Appl. No.: 12/201,637

(22) Filed: Aug. 29, 2008

(65) Prior Publication Data

US 2009/0062640 A1    Mar. 5, 2009

(30) Foreign Application Priority Data

Aug. 31, 2007    (JP) ................................ 2007-225298

(51) Int. Cl.
*A61B 5/055*    (2006.01)
*G01V 3/00*    (2006.01)

(52) U.S. Cl. .................... 600/419; 600/410; 324/307

(58) Field of Classification Search .......... 600/410, 600/419; 324/307
See application file for complete search history.

(56) References Cited

U.S. PATENT DOCUMENTS

| | | | |
|---|---|---|---|
| 4,715,383 A | 12/1987 | Ehman et al. | |
| 5,500,593 A | 3/1996 | Loncar et al. | |
| 5,588,431 A * | 12/1996 | Mani et al. | 600/410 |
| 5,657,757 A | 8/1997 | Hurd et al. | |
| 5,842,989 A * | 12/1998 | Zur | 600/410 |
| 6,192,264 B1 | 2/2001 | Foo et al. | |
| 6,246,897 B1 | 6/2001 | Foo et al. | |
| 6,469,505 B1 | 10/2002 | Maier et al. | |
| 6,486,668 B1 | 11/2002 | Ma | |
| 6,628,116 B1 | 9/2003 | Kraft et al. | |
| 6,630,828 B1 | 10/2003 | Mistretta et al. | |
| 6,968,225 B2 | 11/2005 | Vu | |
| 7,054,675 B2 | 5/2006 | Ma et al. | |
| 7,403,810 B2 * | 7/2008 | Li et al. | 600/419 |
| 7,405,565 B2 | 7/2008 | Miyoshi | |

FOREIGN PATENT DOCUMENTS

JP    2007-082867    4/2007

* cited by examiner

*Primary Examiner* — Michael Rozanski
(74) *Attorney, Agent, or Firm* — Armstrong Teasdale LLP

(57) ABSTRACT

An MRI apparatus for imaging a bodily fluid flowing inside a subject includes a gradient coil which applies gradient pulses to the subject, a transmission coil which transmits RF pulses to the subject, and a control part which controls the gradient coil and the transmission coil. The control part controls the gradient coil and the transmission coil in order to: saturate longitudinal magnetization of the bodily fluid in a field of saturation positioned on an upstream flow of the bodily fluid during a saturation period, invert the direction of longitudinal magnetization of the bodily fluid in an imaging field of view positioned on an downstream flow of the bodily fluid during an inversion period following the saturation period, and acquire MR signals from the bodily fluid in the imaging field of view during a data acquisition period following the inversion period.

20 Claims, 13 Drawing Sheets

MRI APPARATUS

CROSS REFERENCE TO RELATED APPLICATIONS

This application claims the benefit of Japanese Patent Application No. 2007-225298 filed Aug. 31, 2007, which is hereby incorporated by reference in its entirety.

BACKGROUND OF TILE INVENTION

The subject matter disclosed herein relates to an MRI apparatus for imaging of a bodily fluid flowing inside a subject.

MRI apparatus has heretofore been used for imaging of, for example, blood flowing through a blood vessel. One method for imaging of blood takes advantage of an inflow effect of blood flowing through a blood vessel (refer to Japanese Unexamined Patent Publication No. 2007-082867).

In such a known MRI apparatus, for artery/vein separation and rendering an artery image only, it is necessary to capture images two times in the same imaging field of view and obtain a difference between two images captured. Accordingly, there is a problem that it takes time for image acquisition.

BRIEF DESCRIPTION OF THE INVENTION

It is desirable that the problem described previously is solved.

An aspect of the invention provides an MRI apparatus for imaging a bodily fluid flowing inside a subject. The apparatus includes a gradient coil which applies gradient pulses to the subject, a transmission coil which transmits RF pulses to the subject, and a control part which controls the gradient coil and the transmission coil in order to saturate magnetization of the bodily fluid in a field of saturation positioned on an upstream flow of the bodily fluid during a saturation period, invert the direction of longitudinal magnetization of the bodily fluid in an imaging field of view positioned on an downstream flow of the bodily fluid during an inversion period following the saturation period, and acquire MR signals from the bodily fluid in the imaging field of view during a data acquisition period following the inversion period.

The invention has an advantageous effect that imaging of a bodily fluid can be performed in a shorter time, because it is possible in the invention to render an emphasized image of a bodily fluid which is the target of imaging without capturing images twice in the same imaging field of view.

Further objects and advantages of the present invention will be apparent from the following description of the preferred embodiments of the invention as illustrated in the accompanying drawings.

DETAILED DESCRIPTION OF THE INVENTION

In the following, a best mode for carrying out the invention is described in detail with reference to the drawings. It should be understood that the present invention is not limited to the best mode for carrying out the invention.

Figure 1:
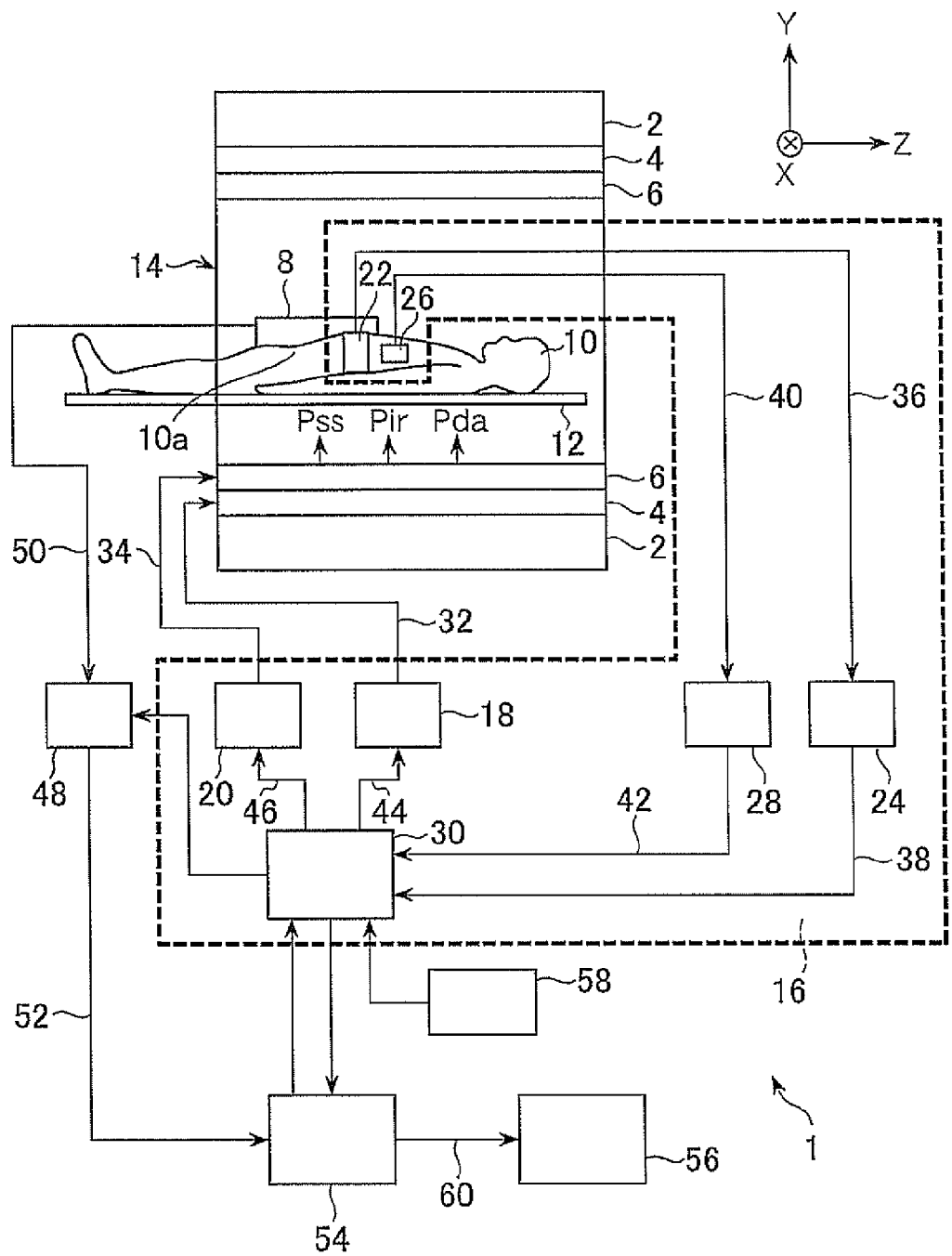
FIG. 1 is a block diagram of an MRI apparatus 1.

FIG. 1 is a block diagram of an MRI apparatus 1. This MRI apparatus 1 is an example of the best mode for carrying out the invention.

As shown in FIG. 1, the MRI apparatus 1 includes a main field coil 2, a gradient coil 4, a transmission coil 6, and a reception coil 8. The main field coil 2, the gradient coil 4, and the transmission coil 6 are assembled coaxially. The reception coil 8 is installed so as to come close to an imaging target portion 10a of a subject 10.

The MRI apparatus 1 further includes a cradle 12 on which the subject 10 is supported and a drive part (not shown) for moving the cradle 12 in z direction. As this drive part moves the cradle 12 in z direction, the cradle 12 moves into the space (bore) 14 inside the transmission coil 6.

The main field coil 2 produces a magnetic field (horizontal magnetic field) in z direction in the bore 14.

the gradient coil 4 applies gradient magnetic fields in the directions of three axes (slice axis, phase axis, and frequency axis) that are perpendicular to each other.

The transmission coil 6 transmits RF pulses to the bore 14.

The reception coil 8 converts MR signals received from the imaging target portion 10a of the subject 10 into electric signals. Alternatively, the transmission coil 6 may be configured to work as the reception coil 8 also.

The MRI apparatus 1 further includes a coil control part 16 (the part enclosed by dotted lines in FIG. 1) that controls the gradient coil 4 and the transmission coil 6.

The control part 16 includes a gradient coil driver 18, transmitter 20, bellows 22, a breathing signal analyzer 24, a heartbeat sensor 26, an electrocardiographic (ECU) signal analyzer 28, and a sequencer 30.

The bellows 22 detects breathing-induced motion of the body of the subject 10 and transmits a breathing signal 36 to the breathing signal analyzer 24. The breathing signal analyzer 24 analyzes the breathing signal 36 and outputs a breathing sync signal 38 to the sequencer 30. The breathing sync signal 38 is a signal that is used to synchronize timing at which the gradient coil 4 applies gradient pulses and timing at which the transmission coil 6 transmits RF pulses with the breathing.

The heartbeat sensor 26 detects the heartbeat of the subject 10 and transmits an ECG signal 40 to the ECG signal analyzer 28. The ECG signal analyzer 28 analyzes the ECG signal 40 and outputs a heartbeat sync signal 42 to the sequencer 30. The heartbeat sync signal 42 is a signal that is used to synchronize timing at which the gradient coil 4 applies gradient pulses and timing at which the transmission coil 6 transmits RF pulses with the heartbeat.

The sequencer 30 supplies a control signal 44 to the gradient coil driver 18, based on the breathing sync signal 38 and the heartbeat sync signal 42 among others. Based on the control signal 44, the gradient coil driver 18 supplies a drive signal 32 for driving the gradient coil 4 to the gradient coil 4.

The sequencer 30 also supplies a control signal 46 to the transmitter 20, based on the breathing sync signal 38 and the heartbeat sync signal 42 among others. Based on the control signal 46, the transmitter 20 transmits a drive signal 34 for driving the transmission coil 6 to the transmission coil 6.

The MRI apparatus 1 further includes a receiver 48, a data processing unit 54, a display unit 56, and an operation unit 58.

The receiver 48 receives a data signal 50 relating to the imaging target portion 10a from the reception coil 8 and converts the received data signal 50 into a digital signal 52.

The data processing unit 54 stores the digital signal 52 that has been output from the receiver 48 into a memory. The data processing unit 54 reconstructs an image from the digital signal 52 and outputs an image signal 60.

The display unit 56 receives the image signal 60 from the data processing unit 54 and displays the image.

The operation unit 58 is connected to the sequencer 30. The operation unit 58 is operated by an operator who operates the MRI apparatus 1. The operator sends various commands, information, etc. via the operation unit 58 to the sequencer 30. The operator can operate the MRI apparatus 1 interactively through the display unit 56 and the operation unit 58.

Then, imaging operation of the MRI apparatus 1 configured as above is described. Taking an example of imaging of arterial blood of the subject 10 by the MRI apparatus 1, the imaging operation is explained.

Figure 2:
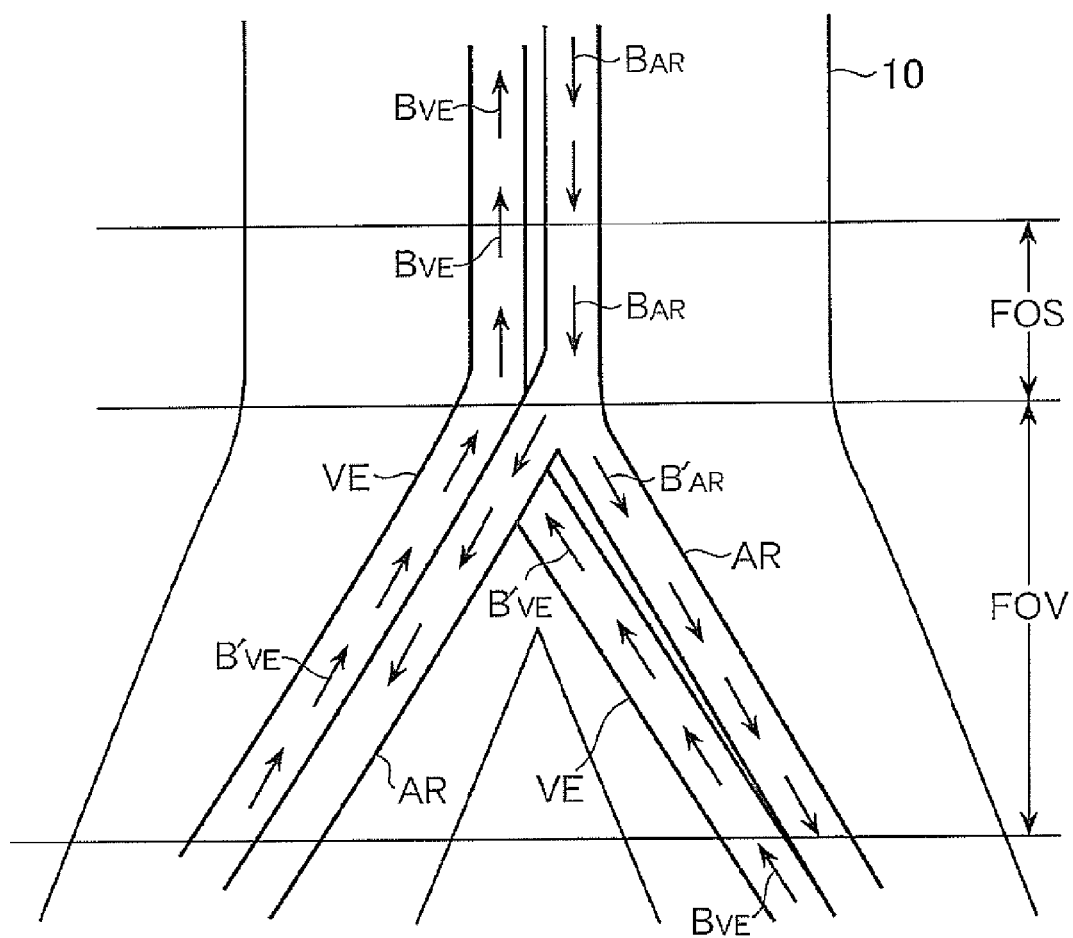
FIG. 2 schematically depicts an imaging field of view FOV of a subject 10.

FIG. 2 schematically depicts an imaging field of view FOV of the subject 10.

The imaging field of view FOV includes femoral artery AR and vein VE. Arterial blood and venous blood flowing within the imaging field of view FOV are denoted by an arrow $B'_{AR}$ and an arrow $B'_{VE}$, respectively. Arterial blood and venous blood flowing outside the imaging field of view FOV are denoted by an arrow $B_{AR}$ and an arrow $B_{VE}$, respectively.

To capture an image of arterial blood flowing in the imaging field of view FOV, the MRI apparatus 1 drives the gradient coil 4 and the transmission coil 6 in accordance with a pulse sequence.

Figure 3:
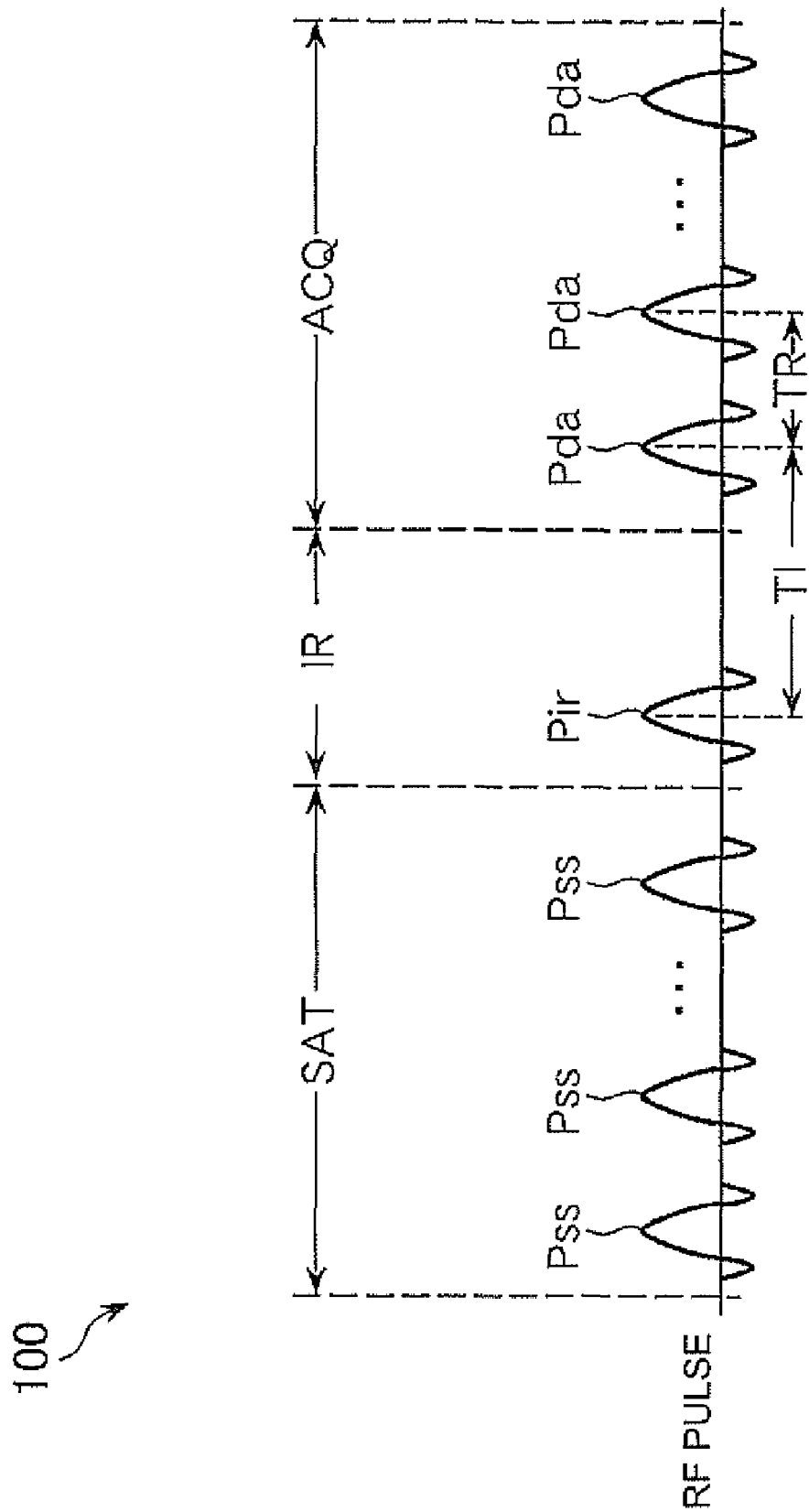
FIG. 3 depicts a pulse sequence 100 that is executed by the MRI apparatus 1.

FIG. 3 depicts a pulse sequence 100 that is executed by the MRI apparatus 1.

The pulse sequence 100 includes a saturation period SAT, an inversion period IR, and a data acquisition period ACQ. In FIG. 3, RF pulses that are transmitted by the transmission coil 6 are shown, but gradient fields that are applied by the gradient coil 4 are not shown for explanatory convenience.

The pulse sequence 100 is explained below more specifically.

Figure 4:
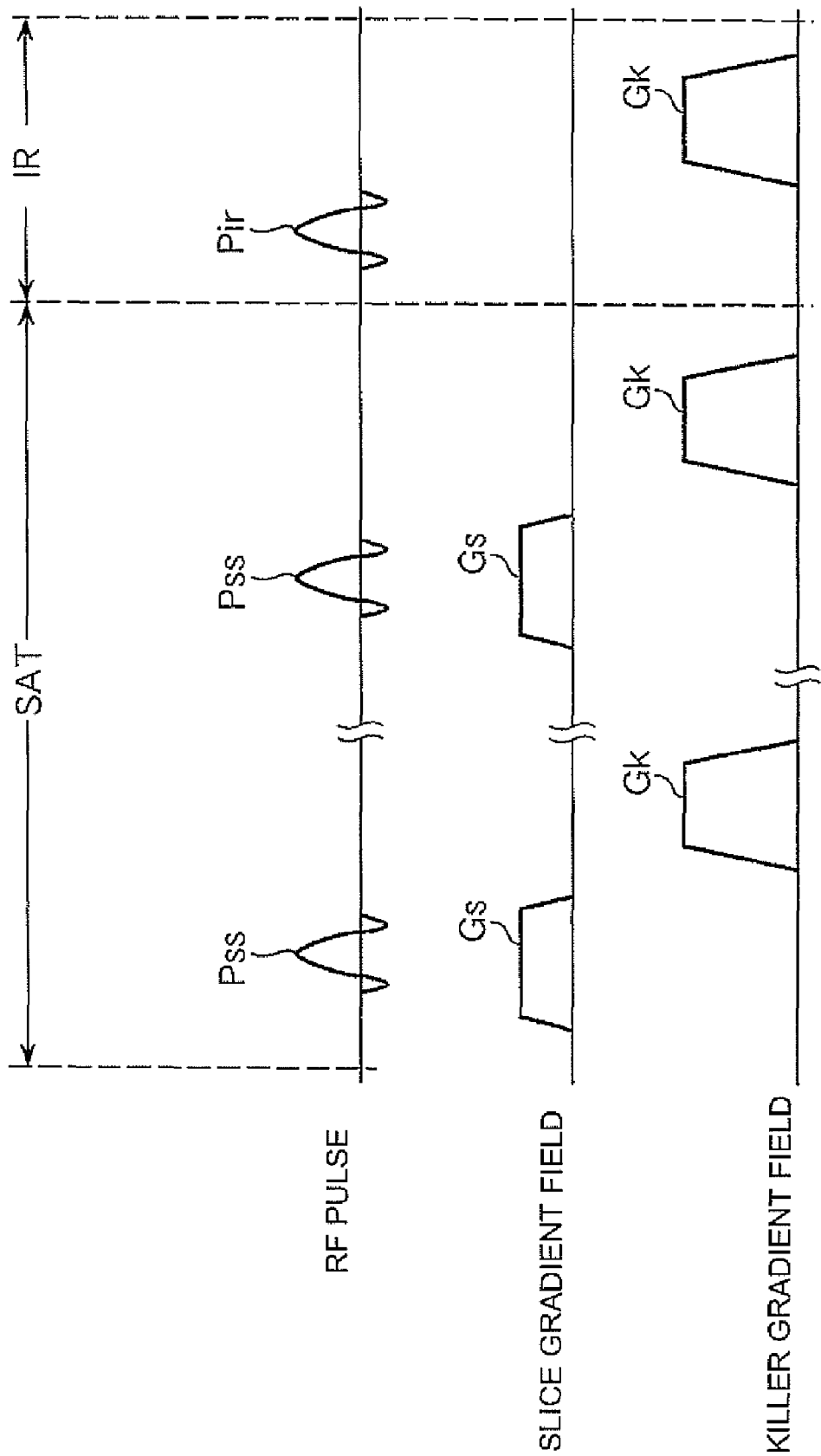
FIG. 4 specifically depicts a saturation period SAT and an inversion period IR of the pulse sequence 100.

FIG. 4 specifically depicts the saturation period SAT and the inversion period IR of the pulse sequence 100.

The transmission coil 6 transmits a spatial pre-saturation pulse Pss during the saturation period SAT. The spatial pre-saturation pulse Pss is transmitted, while a slice gradient pulse Gs is applied, as seen in FIG. 4. After the slice gradient pulse Gs is applied, a killer gradient pulse Gk is applied. A combination of pulses Pss, Gs, and Gk is repeatedly transmitted (applied) during the saturation period. SAT. The length of the saturation period SAT is, for example, two seconds. If the length of the period SAT is two seconds, the spatial pre-saturation pulse Pss is transmitted, for example, 40 times at intervals of 50 msec.

These pulses Pss, Gs, and Gk are set so that a longitudinal magnetization component and a transverse magnetization component of arterial blood $B_{AR}$ flowing in a field of saturation FOS adjacent to the imaging field of view FOV (see FIG. 2, an arterial blood flow upstream of the imaging field of view FOV) are saturated. Thus, before the arterial blood $B_{AR}$ flows into the imaging field of view FOV, its longitudinal magnetization component and transverse magnetization component are saturated.

After the end of the saturation period SAT, the inversion period IR follows.

During the inversion period IR, an inversion pulse Pir is transmitted. The inversion pulse Pir is transmitted, while no slice gradient pulse is applied (that is, the field gradient is zero), as seen in FIG. 4. So, the inversion pulse Pir is a slice non-selective pulse. After the inversion pulse Pir is transmitted, a killer gradient pulse Gk is applied. After the end of the inversion period IR, the data acquisition period ACQ follows.

Figure 5:
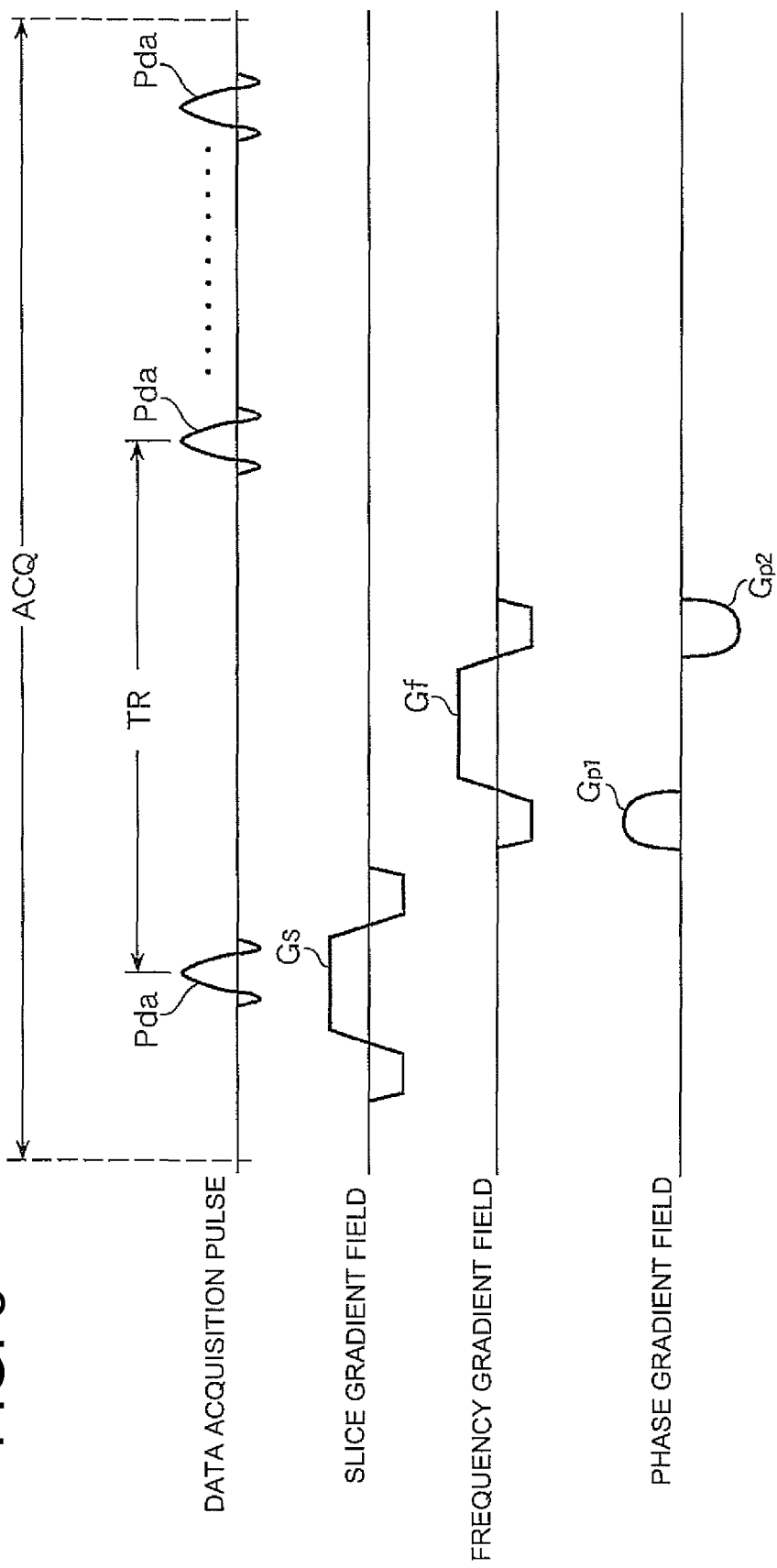
FIG. 5 specifically depicts a data acquisition period ACQ of the pulse sequence 100.

FIG. 5 specifically depicts the data acquisition period ACQ of the pulse sequence 100.

The data acquisition period ACQ is a period during which MR signals are acquired from the imaging field of view FOV (see FIG. 2). The transmission coil 6 transmits RF pulses (hereinafter referred to as "data acquisition pulses") Pda that are set to enable the acquisition of MR signals from the imaging field of view FOV (see FIG. 2). A data acquisition pulse Pda is transmitted, while the gradient coil 4 applies a slice gradient pulse Gs. The data acquisition pulse Pda is transmitted upon the elapse of an inversion time TI after the inversion pulse Pir is transmitted (see FIG. 3). Here, the inversion time TI is a time from the transmission of the inversion pulse Pir until a longitudinal magnetization component of venous blood becomes zero.

The gradient coil 4 further applies a frequency gradient pulse Gf and phase gradient pulses Gp1 and Gp2. The pulses Pda, Gs, Of, Gp1, and Gp2 as shown in FIG. 5 are repeatedly transmitted (applied) for every TR time.

By executing such pulse sequence 100, the MRI apparatus 1 captures an image of arterial blood flowing in the imaging field of view FOV.

As shown in FIG. 3, the pulse sequence 100 has the saturation period SAT and the inversion period IR before the data acquisition period ACQ. The saturation period SAT and the inversion period IR are the periods provided to reduce the inflow effect of venous blood $B'_{VE}$. It should be noted that the pulse sequence 100 (see FIG. 3) has the inversion period IR besides the saturation period SAT in order to reduce the inflow effect of venous blood $B'_{VE}$.

Figure 6:
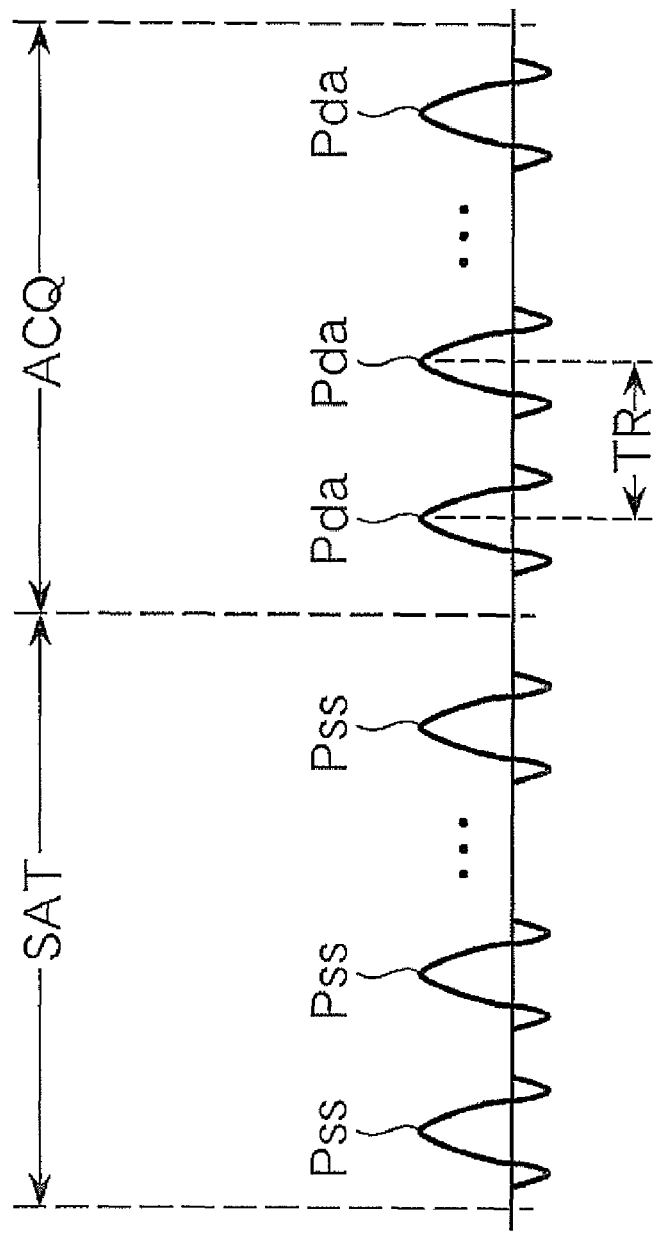
FIG. 6 roughly depicts a pulse sequence used by a known MRI apparatus.

FIG. 6 roughly depicts the pulse sequence used by a known MRI apparatus.

The pulse sequence 100' shown in FIG. 6 has a saturation period SAT and a data acquisition period ACQ like the pulse sequence 100 shown in FIG. 3. However, the pulse sequence of prior art 100' does not have an inversion period IR.

The use of the pulse sequence 100 shown in FIG. 3 produces an advantageous effect that a perfusion image in which arterial blood $B'_{AR}$ is sufficiently emphasized relative to venous blood $B'_{VE}$ can be captured at a high speed. On the other hand, the use of the pulse sequence of prior art 100' shown in FIG. 6 poses a problem in which it takes time to capture a perfusion image in which arterial blood B'$_{AR}$ is sufficiently emphasized relative to venous blood B$_{VE}$. To explain this problem specifically, the following simulation S1 was performed.

(S1) Simulation of the longitudinal magnetization components of arterial blood and venous blood in the case where the saturation period SAT is provided, but the inversion period IR is not provided before the data acquisition period ACQ.

This simulation S1 is described below.

Figure 7:
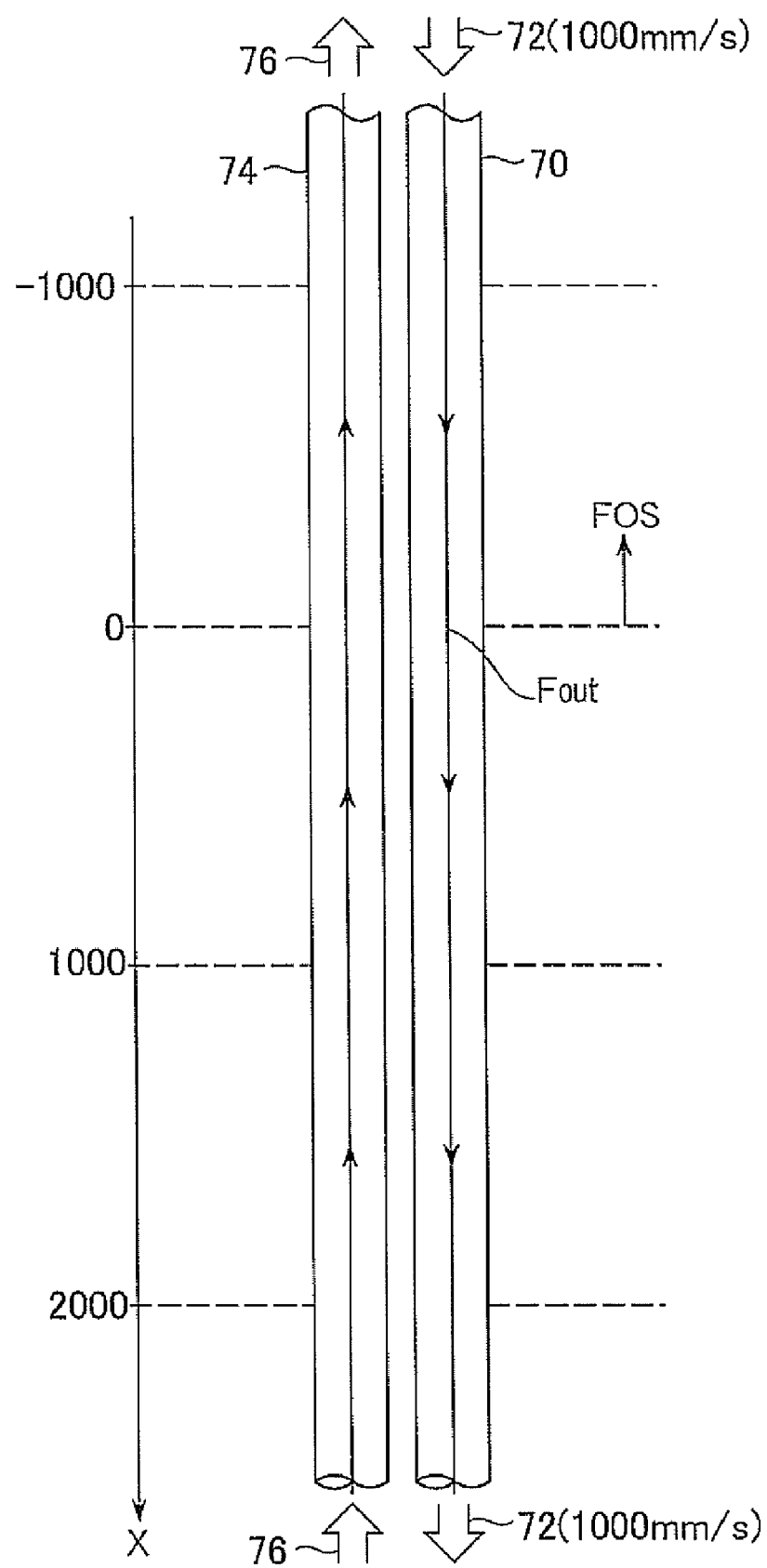
FIG. 7 is a diagram for explaining simulation conditions of a simulation S1.

FIG. 7 is a diagram for explaining simulation conditions of the simulation S1. The simulation conditions are as follows: (a) an artery 70 and a vein 74 extend straightly; (b) arterial blood 72 flows through the artery 70 at a constant rate such as approximately 1000 millimeters per second (mm/s); (c) venous blood 76 flows in a direction opposite to the arterial blood 72 flow; (d) the flow rate of the venous blood 76 is assumed to be zero, as the flow rate of the venous blood 76 is sufficiently slower than the flow rate of the arterial blood 72; (e) beating is ignored; and (f) during the saturation period SAT, the longitudinal magnetization components of the arterial blood 72 and the venous blood 76 within a range where x<0 (the field of saturation FOS) are saturated.

Figure 8:
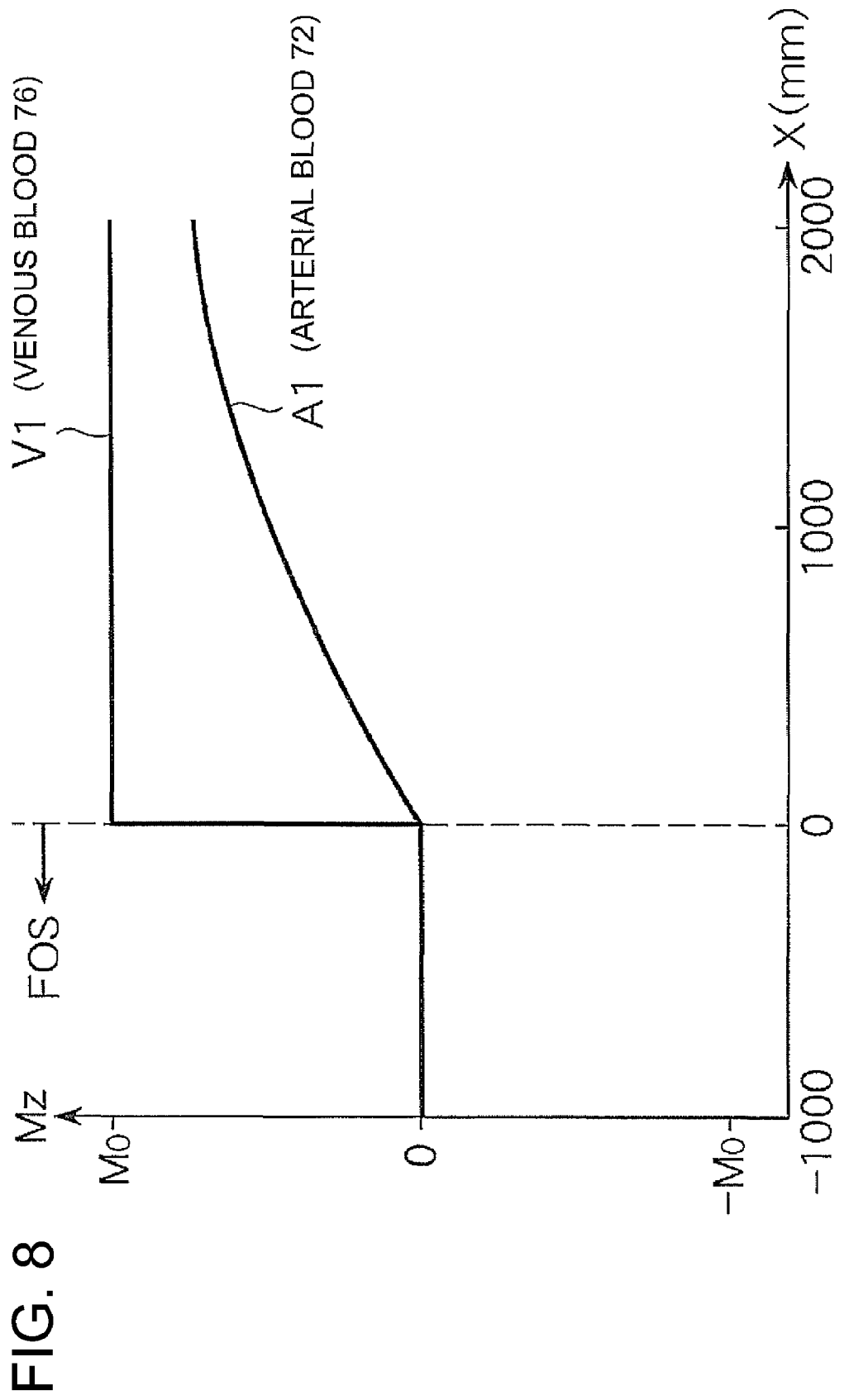
FIG. 8 is a graph showing a result of the simulation S1.

FIG. 8 is a graph showing a result of the simulation S1.

FIG. 8 indicates the simulation result of the longitudinal magnetization components of the arterial blood 72 and the venous blood 76 at the time of end of the saturation period SAT.

The abscissa denotes a distance x (mm) of the artery 70 (and the vein 74) shown in FIG. 7 from the origin. Here, the origin is a position Fout at which the arterial blood 72 flows out of the field FOS. The ordinate denotes the longitudinal magnetization components Mz of the arterial blood 72 and the venous blood 76. In FIG. 8, a line A1 indicates a change in the longitudinal magnetization component Mz of the arterial blood 72 and a line V1 indicates a change in the longitudinal magnetization component Mz of the venous blood 76. In the following, the longitudinal magnetization component Mz of the arterial blood 72 and the longitudinal magnetization component Mz of the venous blood 76 are described in order.

(1) Longitudinal magnetization component. Mz of arterial blood 72 (line A1)

(i) Domain where −1000 mm≦x≦0 mm

The longitudinal magnetization component of the arterial blood 72 is saturated, while the arterial blood flows in the domain where −1000 mm≦x≦0 mm (see the simulation condition (f)). Thus, the longitudinal magnetization component Mz of the arterial blood 72 is zero.

(ii) Domain where 0≦x≦2000 mm

As above, the longitudinal magnetization component Mz of the arterial blood 72 is zero in the domain where −1000 mm≦x≦0 mm. So, the arterial blood 72 flows out from the position Fout with its longitudinal magnetization component Mz being zero. Thus, the longitudinal magnetization component. Mz of the arterial blood 72 is zero immediately after the blood has flown out from the position Fout. However, from immediately after the blood has flown out from the position Fout, the longitudinal magnetization component Mz of the arterial blood 72 gradually recovers to TI. The longitudinal magnetization component Mz of the arterial blood 72 increases, as the distance x increases, as indicated by the line A1. In FIG. 8, the longitudinal magnetization component Mz of the arterial blood 72 is assumed to be Mz=Mo, when the longitudinal magnetization component Mz of the arterial blood 72 has recovered to TI completely.

(2) Longitudinal magnetization component Mz of venous blood 76 (line V1)

(i) Domain where 0≦x≦2000 mm

Since the venous blood 76 flows in the opposite direction to the arterial blood 72 flow (see the simulation condition (c)), the venous blood 76 flows in the domain where 0≦x≦2000 mm before entering the domain where x<0 (the field of saturation FOS). Therefore, the longitudinal magnetization component Mz of the venous blood 76 flowing in the domain where 0≦x≦2000 mm is not saturated and Mz=Mo.

(ii) Domain where −1000 mm≦x≦0 mm

The longitudinal magnetization component Mz of the venous blood 76 is saturated, while the venous blood 76 flows in the domain where −1000 mm≦x≦0 mm (see the simulation condition (f)). So, the longitudinal magnetization component Mz of the venous blood 76 is zero.

The longitudinal magnetization component. Mz of the arterial blood 72 (line A1) increases, as the distance x increases. However, the longitudinal magnetization component Mz of the arterial blood 72 (line A1) is smaller than the longitudinal magnetization component Mz of the venous blood 76 (line V1). Consequently, providing only the saturation period SAT before the data acquisition period ACQ only results in a perfusion image in which the venous blood 76 is emphasized rather than the arterial blood 72. From the result of the simulation S1 shown in FIG. 8, it can be seen that image data acquisition using the pulse sequence of prior art 100' (see FIG. 6), if only executed, cannot produce a perfusion image in which the arterial blood 72 is emphasized. Thus, when the pulse sequence of prior art 100' is used, image data is acquired again using another pulse sequence after image data has been acquired using the pulse sequence of prior art 100' and a difference between the image data thus acquired twice is obtained. By obtaining the difference between the image data acquired twice, a perfusion image in which the arterial blood 72 is emphasized is produced. However, because image data needs to be acquired twice, there is a problem that the image capturing time becomes longer.

To solve this problem, the pulse sequence 100 that is used in the MRI apparatus 1 of the present embodiment has the inversion period IR following the saturation period SAT before the data acquisition period ACQ (see FIG. 3). By providing the inversion period IR, a perfusion image in which the arterial blood 72 is emphasized can be captured in a shorter time. The reason why a perfusion image in which the arterial blood 72 is emphasized can be captured in a shorter time is explained below. To explain this reason, the following simulation S2 was performed.

(S2) Simulation of the longitudinal magnetization components of arterial blood and venous blood in the case where the inversion period IR is provided following the saturation period SAT before the data acquisition period ACQ.

The simulation conditions of the simulation S2 are the same as the simulation conditions (a) to (f) of the simulation S1. However, for the simulation S2, the following simulation condition (g) is added.

(g) During the inversion period IR, the longitudinal magnetization components of arterial blood 72 and venous blood 76 within a range where −1000 mm≦x≦2000 mm are inverted.

Figure 9:
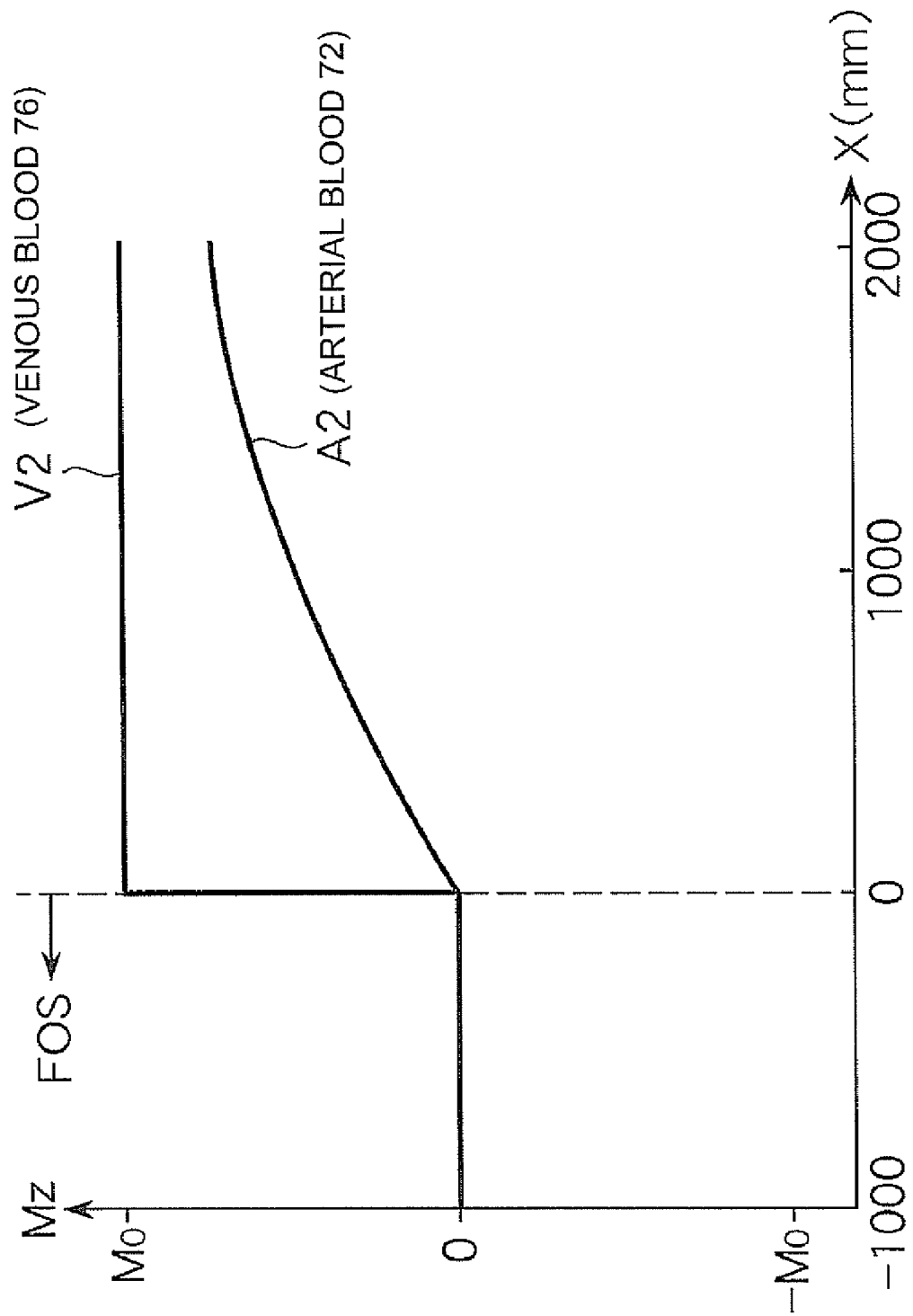
FIG. 9 is a graph showing a result of simulation of the longitudinal magnetization components Mz of arterial blood 72 and venous blood 76 at the end of the saturation period SAT.
Figure 10:
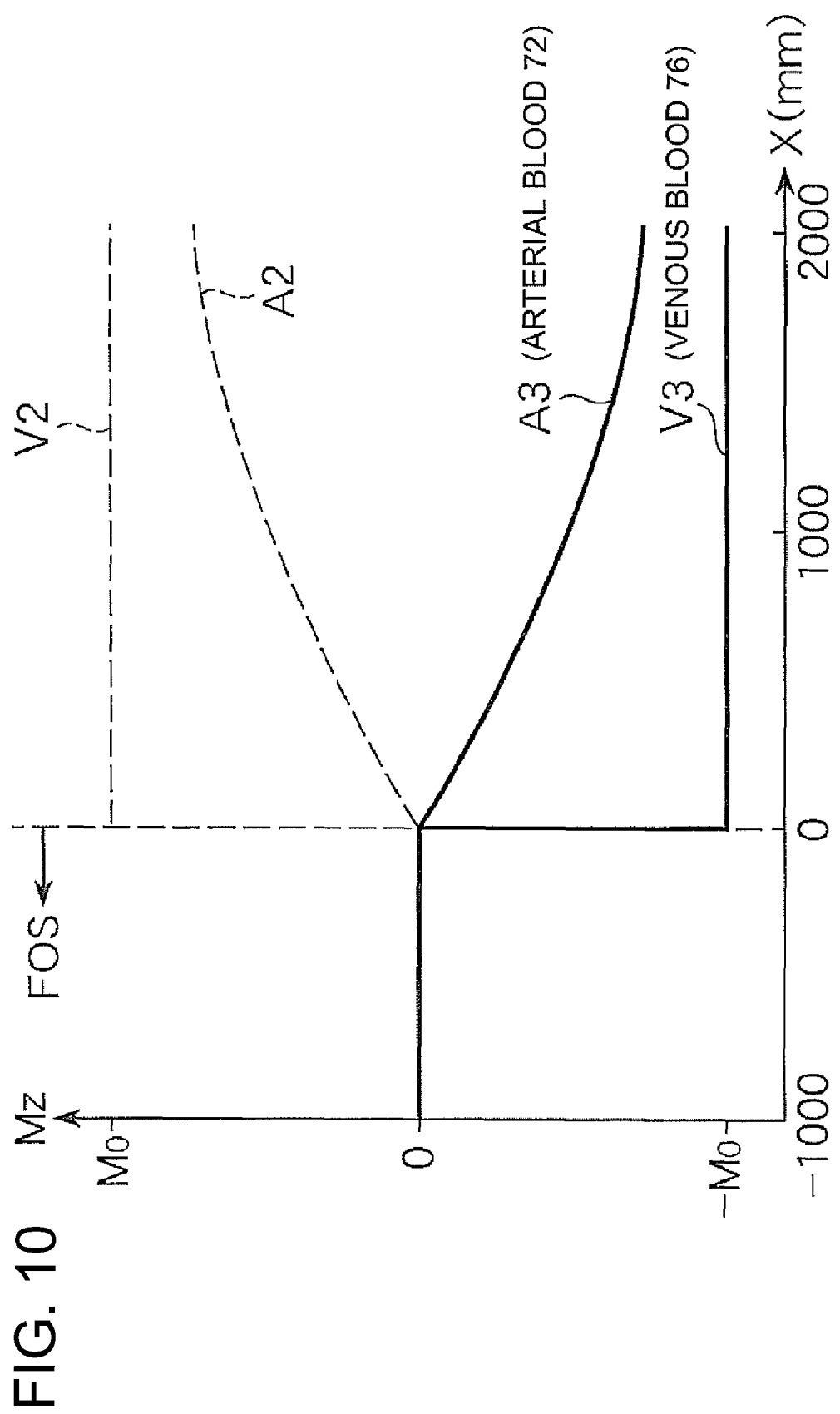
FIG. 10 is a graph showing a result of simulation of the longitudinal magnetization components Mz of arterial blood 72 and venous blood 76 at the end of transmission of an inversion pulse Pir that is transmitted during the inversion period IR.
Figure 11:
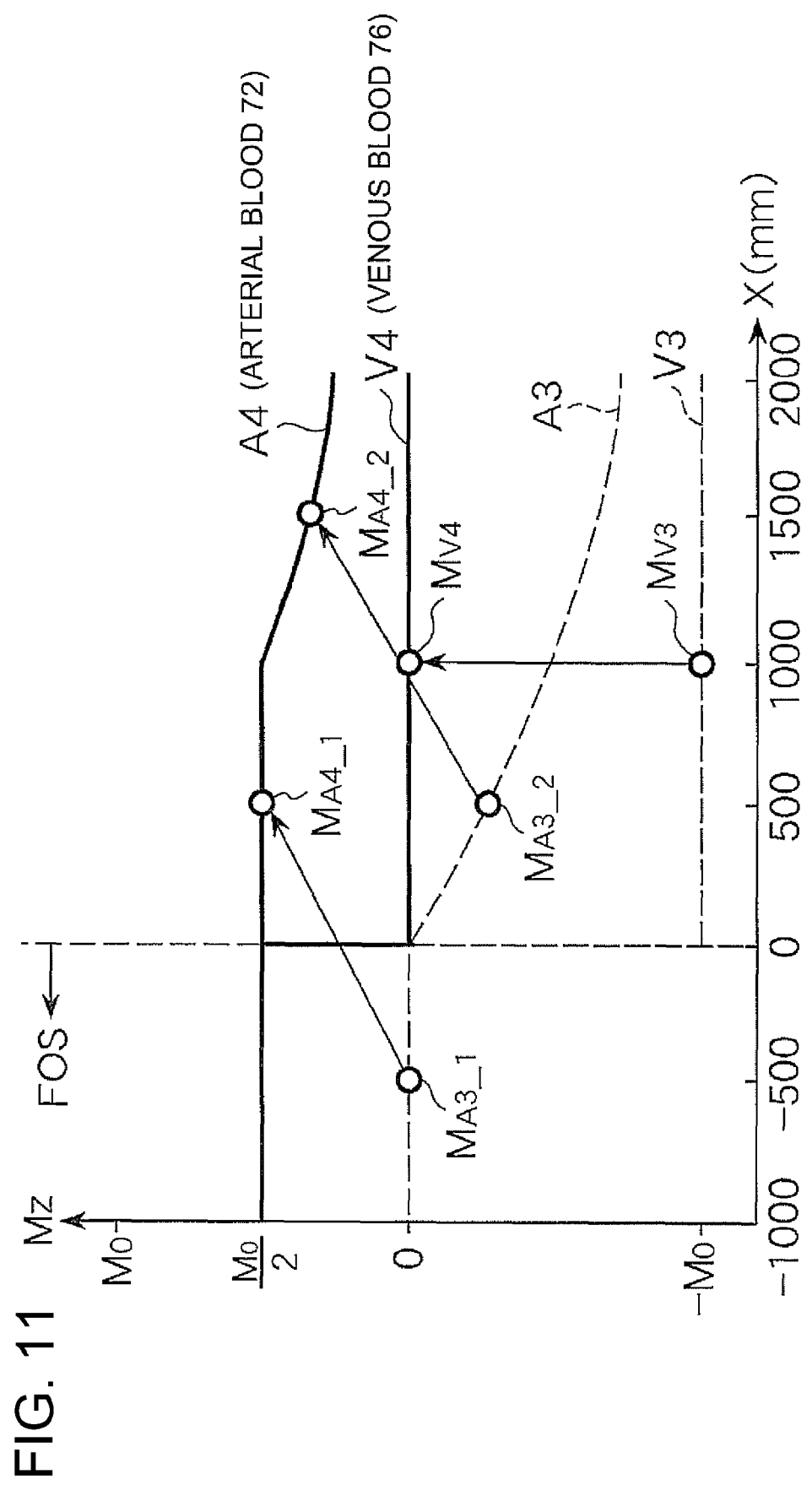
FIG. 11 is a graph showing a result of simulation of the longitudinal magnetization components Mz of arterial blood 72 and venous blood 76 upon the elapse of an inversion time TI following the inversion pulse Pir transmitted.

FIGS. 9 through 11 are graphs showing results of the simulation S2. The abscissa and ordinate of the graphs of FIGS. 9 through 11 are the same as the abscissa and ordinate of the graph of FIG. 8.

FIG. 9 is a graph showing a result of simulation of the longitudinal magnetization components Mz of arterial blood 72 and venous blood 76 at the end of the saturation period SAT.

A line A2 indicates a change in the longitudinal magnetization component Mz of the arterial blood 72 and a line V2 indicates a change in the longitudinal magnetization component Mz of the venous blood 76. FIG. 9 indicates the same simulation result as in FIG. 8, because it is the result of the simulation at the end of the saturation period SAT.

FIG. 10 is a graph showing a result of simulation of the longitudinal magnetization components Mz of arterial blood 72 and venous blood 76 at the end of transmission of the inversion pulse Pir that is transmitted during the inversion period IR.

A line A3 indicates a change in the longitudinal magnetization component Mz of the arterial blood 72 and a line V3 indicates a change in the longitudinal magnetization component Mz of the venous blood 76. In FIG. 10, two lines A2 and V2 shown in FIG. 9 are plotted in clotted lines.

When the inversion pulse Pir is transmitted, the longitudinal magnetization component Mz of the arterial blood 72 is inverted from the line A2 to the line A3 and the longitudinal magnetization component Mz of the venous blood 76 is inverted from the line V2 to the line V3.

FIG. 11 is a graph showing a result of simulation of the longitudinal magnetization components Mz of arterial blood 72 and venous blood 76 upon the elapse of an inversion time TI following the inversion pulse Pir transmitted.

A line A4 indicates a change in the longitudinal magnetization component Mz of the arterial blood 72 and a line V4 indicates a change in the longitudinal magnetization component Mz of the venous blood 76. In FIG. 11, two lines A3 and V3 shown in FIG. 10 are plotted in dotted lines. The line V4 and the line A4 are explained in order below.

During the inversion time TI, the longitudinal magnetization component Mz of the venous blood 76 recovers. The amount of the recovery of the longitudinal magnetization component Mz during the inversion time TI depends on the magnitude of the longitudinal magnetization component Mz at the start of the inversion time TI. Therefore, the amount of the recovery of the longitudinal magnetization component Mz differs between the case where $Mz=-M_0$ as the longitudinal magnetization component Mz at the start of the inversion time TI and the case where $Mz=0$ (zero). In the simulation S2, the inversion time TI is set so that Mz recovers from $-M_0$ to 0 (zero), if the longitudinal magnetization component Mz at the start of the inversion time TI is $-M_0$. Accordingly, the longitudinal magnetization component Mz of the venous blood 76 recovers from $-M_0$ to zero in the range where $0 \leq x \leq 2000$ mm.

In the range where $-1000 \leq x \leq 0$, the longitudinal magnetization component Mz changes from 0 (zero) to $M_0/2$.

Thus, during the inversion time TI, the longitudinal magnetization component Mz of the venous blood 76 changes from the line V3 to the line V4.

Because the flow rate of the venous blood 76 is zero (see the simulation condition (d)), the recovery of the longitudinal magnetization component Mz of the venous blood 76 from the line V3 to the line V4 takes place with the distance x being unchanged. For example, the longitudinal magnetization component Mv3 on the line V3 at x=1000 mm recovers at x=1000 mm and changes to the longitudinal magnetization component Mv4 on the line V4 at x=1000 mm.

During the inversion time TI, the longitudinal magnetization component. Mz of the arterial blood 72 also recovers. However, because the arterial blood 72 flows at a constant rate such as approximately 1000 mm/s (see the simulation condition (b)), while the longitudinal magnetization component Mz of the arterial blood 72 recovers, the recovery of the longitudinal magnetization component Mz of the arterial blood 72 does not take place with the distance x being unchanged. For example, the longitudinal magnetization component MA3_1 on the line A3 at x=−500 mm changes to the longitudinal magnetization component MA4_1 on the line A4 at x=500 mm, due to that the arterial blood 72 flows at a constant rate (1000 mm/2). Likewise, the longitudinal magnetization component MA3_2 on the line A3 at x=500 mm changes to the longitudinal magnetization component MA4_2 on the line A4 at x=1500 mm.

Thus, during the inversion time TI, the longitudinal magnetization component Mz of the arterial blood 72 changes from the line A3 to the line A4.

As is apparent from FIG. 11, in the range where $0 \leq x \leq 2000$, the longitudinal magnetization component Mz of the arterial blood 72 has a value larger than 0 (zero) (line A4), whereas the longitudinal magnetization component Mz of the venous blood 76 is 0 (zero) (line V4). Consequently, by providing the inversion period IR following the saturation period SAT before the data acquisition period ACQ, a perfusion image is produced in which the arterial blood 72 is emphasized, but the venous blood 76 is not rendered substantially. From the result of the simulation S2 shown in FIG. 11, it can be seen that image data acquisition using the pulse sequence 100 (see FIG. 3) can produce a perfusion image in which the arterial blood 72 is emphasized, but the venous blood 76 is not rendered substantially. The use of the pulse sequence 100 (see FIG. 3) can produces a perfusion image in which the arterial blood 72 is emphasized, but the venous blood 76 is not rendered substantially, without acquiring image data again using another pulse sequence. Accordingly, if the pulse sequence 100 (see FIG. 3) is used, an image of arterial blood of the subject 10 can be captured in a shorter time.

Returning to FIG. 1, the operation is further explained.

When the MRI apparatus 1 executes the pulse sequence 100 shown in FIG. 3, the reception coil 8 converts MR signals containing information on the arterial blood $B'_{AR}$ (see FIG. 2) into electric signals. The receiver 48 receives a data signal 50 containing the information the arterial blood $B'_{AR}$ (see FIG. 2) from the reception coil 9. The receiver 48 converts the data signal 50 into a digital signal 52 and outputs the latter to the data processing unit 54. The data processing unit 54 reconstructs an image including the arterial blood and this image is displayed on the display unit 56. The display unit displays a perfusion image in which the arterial blood $B'_{AR}$ is emphasized, but substantially does not show the venous blood $B_{VE}$ and, therefore, a medical doctor can perceive the state of flow of the arterial blood AR.

As explained above, the MRI apparatus 1 is capable of capturing a perfusion image in which the arterial blood $B'_{AR}$ is emphasized at a high speed.

The MRI apparatus 1 utilizes the breathing signal 36 and a breathing signal 36 and an ECG signal 40 to determine the timing to transmit the inversion pulse Pir. In the following, how to determine the timing to transmit the inversion pulse Pir is explained with reference to FIG. 1 and FIG. 12.

Figure 12:
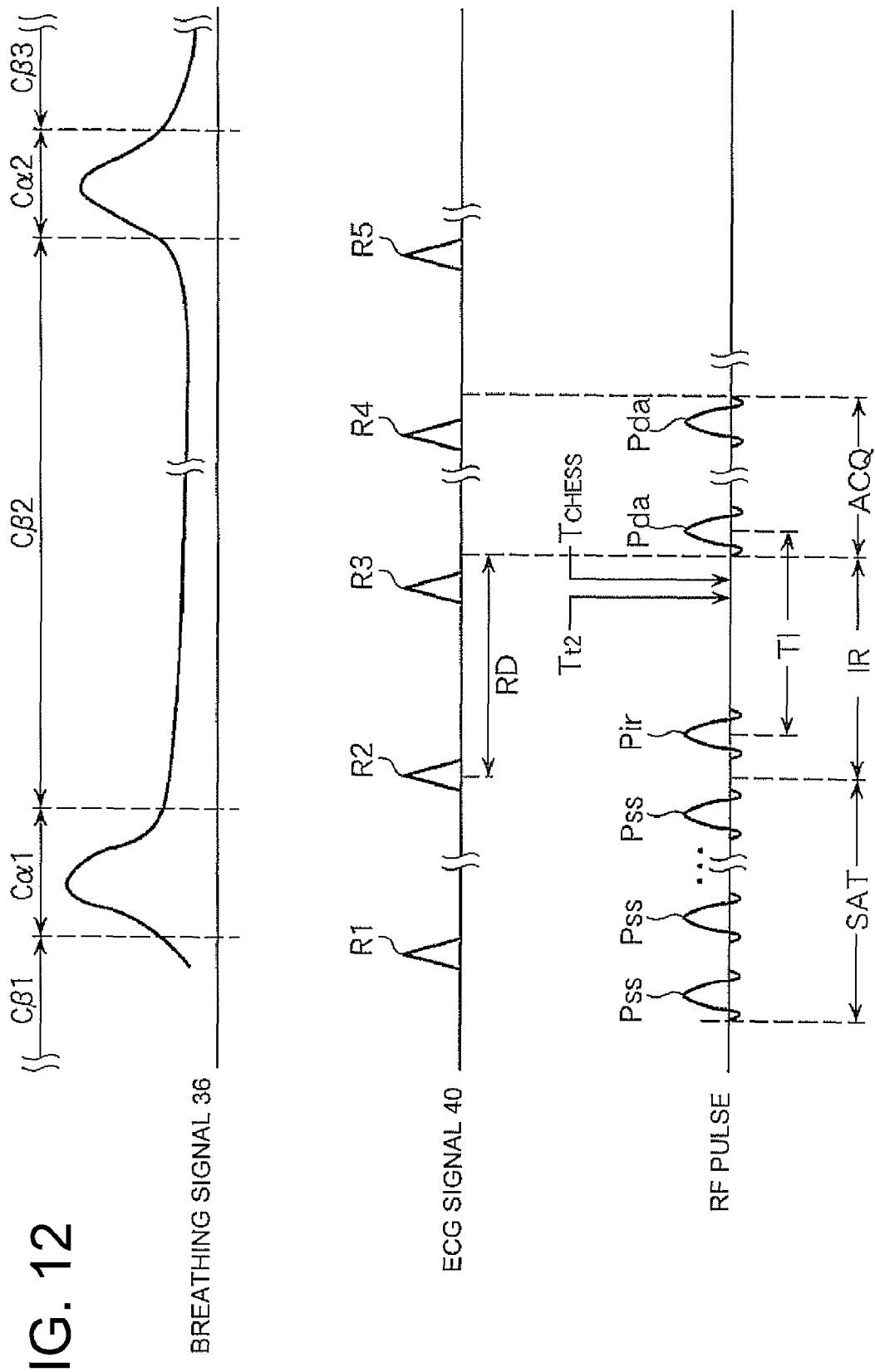
FIG. 12 depicts a breathing signal 36, an ECG signal 40, and the RF pulse shown in FIG. 3.

FIG. 12 depicts a breathing signal 36, an ECG signal 40, and the RF pulse shown in FIG. 3.

In the MRI apparatus 1, as shown in FIG. 1, the bellows 22 outputs a breathing signal 36 to the breathing signal analyzer 24. The breathing signal analyzer 24 analyzes the breathing signal 36 and outputs a breathing sync signal 38 to the sequencer 30. The breathing signal 36 has first breathing periods Cα1, Cα... in which the breathing-induced motion of the body of the subject 10 is large and second breathing periods Cβ1, Cβ2, Cβ3 ... in which the breathing-induced motion of the body of the subject 10 is small. The breathing sync signal 38 is a signal that indicates the transition of the breathing signal 36 from a first breathing period to a second breathing period.

Furthermore, in the MRI apparatus 1, as shown in FIG. 1, the heartbeat sensor 26 outputs an ECG signal 40 to the ECG signal analyzer 28. The ECG signal analyzer 28 analyzes the ECG signal 40 and outputs a heartbeat sync signal 42 to the sequencer 30. This ECG sync signal 42 is a signal that indicates the peak of each R wave (R1, R2, R3, R4, R5 ...) of the ECG signal 40.

Based on the breathing sync signal 38 and the heartbeat sync signal 42 received, the sequencer 30 generates and transmits respective control signals 44 to the gradient coil driver 18 and the transmitter 20. The gradient coil driver 18 and the transmitter 20 drive the coils 4 and 5, based on the control signals 44 and 46. Here, the transmission coil 6 is driven so that an inversion pulse Pir is transmitted in synchronization with an R wave (R2 in FIG. 12) first appearing in the KG signal after transition from a first breathing period (Cα1, Cβ2 ...) to a second breathing period (Cβ1, Cβ2, Cβ3 ...). Thereby, data acquisition can be performed during a second breathing period (Cβ1, Cβ2, Cβ3 ...) in which the breathing-induced motion of the body of the subject 10 is small. By transmitting the inversion pulse Pir in sync with the R wave R2, a time RD from the R wave R2 until the start of the data acquisition period ACQ becomes equal in any second breathing period (Cβ1, Cβ2, Cβ3 ...). Therefore, data acquisition can be performed in the same state of blood flow in any second breathing period (Cβ1, Cβ2, Cβ3 ...).

It is possible to perform data acquisition without detecting breathing and/or heartbeats.

While the MRI apparatus 1 transmits an inversion pulse Pir following a spatial pre-saturation pulse Pss before a data acquisition pulse Pda, an MRI apparatus that transmits an inversion pulse Pir preceding a spatial pre-saturation pulse Pss is known. However, the advantageous effect of the MRI apparatus 1 shown in FIG. 1 cannot be achieved by the MRI apparatus of such a known MRI apparatus. The reason for this is explained below.

Figure 13:
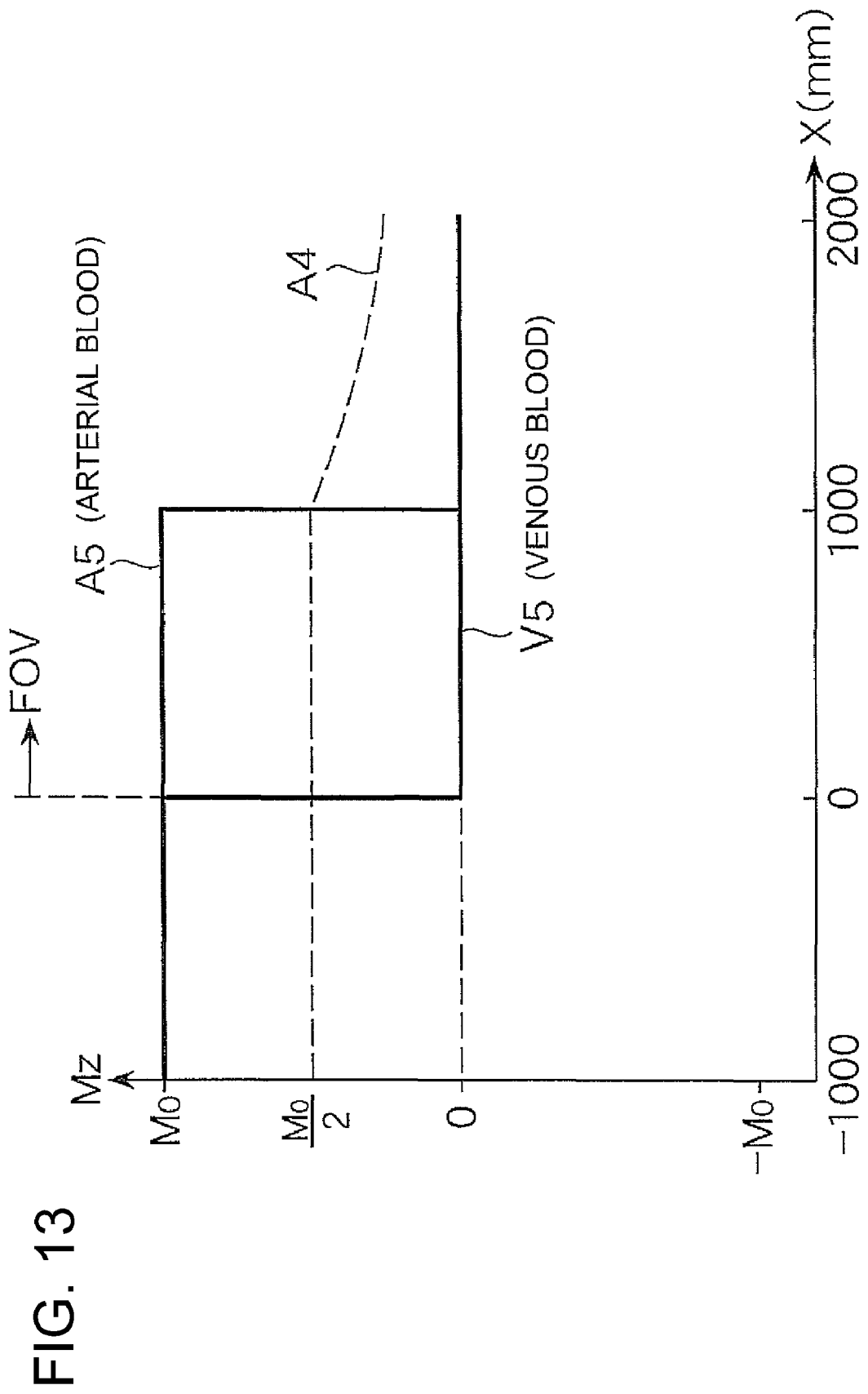
FIG. 13 shows a result of simulation of the longitudinal magnetization components Mz of arterial blood and venous blood upon the elapse of a time TI in the MRI apparatus of U.S. Pat. No. 5,842,989 a known MRI apparatus and a result using various embodiments as described herein.

Such a known MRI apparatus transmits an inversion pulse followed by a spatial pre-saturation pulse and performs data acquisition after the elapse of a time TI after the transmission of the inversion pulse. FIG. 13 shows a result of simulation of the longitudinal magnetization components Mz of arterial blood and venous blood upon the elapse of the time TI in the known MRI apparatus.

In FIG. 13, a line A5 indicates the longitudinal magnetization component Mz of arterial blood and a line V5 indicates the longitudinal magnetization component Mz of venous blood. In FIG. 13, the line A4 shown in FIG. 11 is plotted in dotted lines.

It is seen in FIG. 13 that the longitudinal magnetization component. Mz of venous blood is Mz=0 (zero) within the range where $0 \leq x \leq 2000$. On the other hand, the longitudinal magnetization component Mz of arterial blood is $Mz=M_0$ in the range where $0 \leq x \leq 1000$, but Mz=0 in the range where $1000 \leq x \leq 2000$. Therefore, in the range where $1000 \leq x \leq 2000$, the state of the arterial blood flow cannot be perceived visually.

In contrast, in the MRI apparatus 1 of the present embodiment, the longitudinal magnetization component Mz has a value larger than zero even in the range where $1000 \leq x \leq 2000$, as indicated by the line A4. Hence, it turns out that the MRI apparatus 1 is capable of wider-range imaging of arterial blood in a downstream passage than the known MRI apparatus.

By comparison between such a known MRI apparatus (line A5) and the MRI apparatus 1 (line A4), the longitudinal magnetization component Mz of arterial blood indicated by the line A4 is smaller than the longitudinal magnetization component Mz of arterial blood indicated by the line A5 in the range where $0 \leq x \leq 2000$. Therefore, it may be thought that, in the range where $0 \leq x \leq 2000$, the arterial blood image captured by the MRI apparatus 1 is harder to visually perceive than the arterial blood image captured by such a known MRI apparatus. However, according to the result of the simulation S2 (see FIG. 11), in the range where $0 \leq x \leq 2000$, the longitudinal magnetization component Mz of arterial blood is as large as $M_0/2$ and the longitudinal magnetization component Mz of venous blood is 0 (zero). Hence, it is believed that the state of the arterial blood flow can visually be perceived sufficiently, because the venous blood is not rendered substantially in the perfusion image.

Since a captured image includes muscular tissue, the muscular tissue may make it difficult to perceive the state of the arterial blood flow. In this case, the muscular tissue can substantially be erased from the image by T2 preparation, T2 preparation makes signals from the muscle smaller than signals from the blood, exploiting that transverse relaxation time T2 differs between both. T2 preparation is transmitted after the transmission of an inversion pulse Pir and at a time Tt2 (see FIG. 12) before transmitting a data acquisition pulse Pda. T2 preparation is a technique well known to those skilled in the art and, therefore, its detailed description is omitted.

Since a captured image includes adipose tissue, the adipose tissue may make it difficult to perceive the state of the arterial blood flow. In this case, the adipose tissue can substantially be erased from the image by transmitting a CHESS (or SPECTRAL IR) following the transmission of an inversion pulse Pir before transmitting a data acquisition pulse Pda. CHESS (or SPECTRAL IR) is a technique well known to those skilled in the art and, therefore, its detailed description is omitted. If it is desired to erase both muscular tissue and adipose tissue, it is preferable to transmit a CHESS (or SPECTRAL, IR) following the transmission of a T2 preparation pulse, such as at a time TCHESS.

In the above-described embodiment, for acquiring a perfusion image of arterial blood, rendering of venous blood in the perfusion image is disabled by setting the inversion time TI so that the longitudinal magnetization component of venous blood becomes zero (see FIG. 11). However, the invention may be applied such that it is possible to disable rendering of tissues other than bodily fluids without transmitting additional pulses such as a TS preparation pulse by setting the inversion time TI so that the longitudinal magnetization components of the tissues (e.g., muscles and adipose) other than bodily fluids become zero. In this way, the inversion time TI may be changed appropriately as required.

In the above-described embodiment, imaging of arterial blood is explained by way of example. However, the invention can also be applied to imaging of a bodily fluid (e.g., venous blood, spinal fluid, etc.) other than arterial blood. For instance, for imaging of venous blood, it is possible to produce a perfusion image in which venous blood is emphasized by setting the inversion time TI so that the longitudinal magnetization component of arterial blood becomes zero.

In the above-described embodiment, the inversion pulse Pir is a slice non-selective pulse. Alternatively, the inversion pulse Pir may be a slice selective pulse, provided that the state of the arterial blood flow in the imaging field of view can visually be perceived. Although the MRI apparatus 100 executes the pulse sequence 100 in the present embodiment, the apparatus may execute another pulse sequence, provided that the advantageous effect of the invention is obtained.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI apparatus for imaging of a bodily fluid flowing inside a subject, said apparatus comprising:
    a gradient coil configured to apply gradient pulses to the subject;
    a transmission coil configured to transmit RF pulses to the subject; and
    a control part configured to control said gradient coil and said transmission coil to:
    saturate longitudinal magnetization of the bodily fluid in a field of saturation positioned on an upstream flow of the bodily fluid during a saturation period;
    invert the direction of longitudinal magnetization of the bodily fluid in an imaging field of view positioned on a downstream flow of the bodily fluid during an inversion period following the saturation period, wherein said imaging field of view is downstream from said field of saturation; and
    acquire MR signals from the bodily fluid in said imaging field of view during a data acquisition period following the inversion period.

2. The MRI apparatus according to claim 1, wherein said transmission coil is configured to transmit saturation pulses during the saturation period, an inversion pulse during the inversion period, and data acquisition pulses during the data acquisition period.

3. The MRI apparatus according to claim 2, wherein said transmission coil is configured to begin transmission of the data acquisition pulses upon the elapse of an inversion time following the inversion pulse transmitted.

4. The MRI apparatus according to claim 3, wherein the bodily fluid is arterial blood, and the inversion time is a time from the transmission of the inversion pulse until a longitudinal magnetization component of venous blood becomes zero.

5. The MRI apparatus according to claim 4, wherein said gradient coil is configured to apply slice gradient pulses during the saturation period, and said transmission coil is configured to transmit each of the saturation pulses while said gradient coil applies a slice gradient pulse.

6. The MRI apparatus according to claim 5, wherein said gradient coil is configured to apply a killer gradient pulse after applying each of the slice gradient pulses during the saturation period.

7. The MRI apparatus according to claim 6, wherein the inversion pulse is a slice non-selective pulse.

8. The MRI apparatus according to claim 2, wherein said control part is configured to acquire a breathing signal from the subject and to control said gradient coil and said transmission coil based on the breathing signal.

9. The MRI apparatus according to claim 8, wherein said control part comprises:
    a bellows configured to detect breathing-induced motion of the body of the subject and to output the breathing signal; and
    a breathing signal analyzer configured to analyze the breathing signal and to output a breathing sync signal, wherein said control part is configured to control said gradient coil and said transmission coil based on the breathing sync signal.

10. The MRI apparatus according to claim 9, wherein the breathing signal includes a first breathing period and a second breathing period in which the breathing-induced motion is smaller than in the first breathing period, and said control part is configured to control said transmission coil so that said transmission coil transmits the data acquisition pulses during the second breathing period.

11. The MRI apparatus according to claim 2, wherein said control part is configured to acquire an electrocardiographic (ECG) signal from the subject and to control said gradient coil and said transmission coil based on the ECG signal.

12. The MRI apparatus according to claim 11, wherein said control part comprises:
    a heartbeat sensor configured to detect the heartbeat of the subject and to output the ECG signal; and
    an ECG signal analyzer configured to analyze the ECG signal and to output an ECG sync signal, wherein said control part is configured to control said gradient coil and said transmission coil based on the ECG sync signal.

13. The MRI apparatus according to claim 12, wherein said control part is configured to control said transmission coil such that said transmission coil transmits the inversion pulse in synchronization of an R wave of the ECG signal.

14. The MRI apparatus according to claim 2, wherein said control part is configured to acquire a breathing signal and an ECG signal from the subject and to control said gradient coil and said transmission coil based on the breathing signal and the ECG signal.

15. The MRI apparatus according to claim 14, wherein the breathing signal includes a first breathing period and a second breathing period in which breathing-induced motion is smaller than in the first breathing period, and said control part is configured to control said transmission coil such that said transmission coil transmits the inversion pulse in synchronization with an R wave first appearing in the ECG signal after transition of the breathing signal from the first breathing period to the second breathing period.

16. The MRI apparatus according to claim 2, wherein said transmission coil is configured to transmit a T2 preparation pulse following transmission of the inversion pulse before starting to transmit the data acquisition pulses.

17. The MRI apparatus according to claim 2, wherein said transmission coil is configured to transmit one of a CHESS pulse and a SPECTRAL IR pulse following transmission of the inversion pulse before starting to transmit the data acquisition pulses.

18. The MRI apparatus according to claim 1, wherein said transmission coil is configured to receive MR signals from the subject.

19. The MRI apparatus according to claim 1, wherein the bodily fluid is venous blood.

20. The MRI apparatus according to claim 1, wherein the bodily fluid is a spinal fluid.

* * * * *

UNITED STATES PATENT AND TRADEMARK OFFICE
CERTIFICATE OF CORRECTION

| | |
|---|---|
| PATENT NO. | : 8,126,532 B2 |
| APPLICATION NO. | : 12/201637 |
| DATED | : February 28, 2012 |
| INVENTOR(S) | : Miyoshi |

It is certified that error appears in the above-identified patent and that said Letters Patent is hereby corrected as shown below:

In Column 1, Line 10, in Heading, delete "Tile" and insert -- THE --, therefor.

In Column 2, Line 47, delete "the" and insert -- The --, therefor.

In Column 2, Line 60, delete "(ECU)" and insert -- (ECG) --, therefor.

In Column 3, Line 64, delete "period." and insert -- period --, therefor.

In Column 4, Line 5, delete "period." and insert -- period --, therefor.

In Column 4, Line 45, delete "Of," and insert -- Gf, --, therefor.

In Column 5, Line 4, delete "$B_{VE}.$" and insert -- $B'_{VE}.$ --, therefor.

In Column 5, Lines 56-57, delete "component." and insert -- component --, therefor.

In Column 6, Line 18, delete "component." and insert -- component --, therefor.

In Column 7, Line 20, delete "clotted" and insert -- dotted --, therefor.

In Column 7, Line 66, delete "component." and insert -- component --, therefor.

In Column 8, Line 50, delete "$B_{VE}$" and insert -- $B'_{VE}$ --, therefor.

In Column 9, Line 1, delete "Cal, Cat . . ." and insert -- $C\alpha1, C\alpha2 \ldots$ --, therefor.

In Column 9, Line 22, delete "KG" and insert -- ECG --, therefor.

In Column 9, Line 23, delete "Cβ2" and insert -- $C\alpha2$ --, therefor.

Signed and Sealed this
Ninth Day of October, 2012

David J. Kappos
*Director of the United States Patent and Trademark Office*

CERTIFICATE OF CORRECTION (continued)
U.S. Pat. No. 8,126,532 B2

In Column 9, Line 57, delete "component." and insert -- component --, therefor.

In Column 10, Line 24, delete "preparation," and insert -- preparation. --, therefor.

In Column 10, Line 41, delete "SPECTRAL," and insert -- SPECTRAL --, therefor.